US006195296B1

(12) United States Patent
Cheol

(10) Patent No.: US 6,195,296 B1
(45) Date of Patent: Feb. 27, 2001

(54) SEMICONDUCTOR MEMORY DEVICE AND SYSTEM

(75) Inventor: Kim-Eun Cheol, Kwachon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/437,635

(22) Filed: Nov. 10, 1999

(30) Foreign Application Priority Data

Nov. 10, 1998 (KR) .................................................. 98-47979

(51) Int. Cl.$^7$ ....................................................... G11C 7/00
(52) U.S. Cl. ........................................ 365/189.05; 365/233
(58) Field of Search ........................ 365/189.05, 189.01, 365/230.06, 233, 233.5

(56) References Cited

U.S. PATENT DOCUMENTS 6,026,031 * 2/2000 Porter et al. .................... 365/189.08
6,052,315 * 4/2000 Katayama et al. ............. 365/189.05

\* cited by examiner

*Primary Examiner*—Vu A. Le
(74) *Attorney, Agent, or Firm*—Marger Johnson & McCollom, P.C.

(57) ABSTRACT

The system has a predetermined number of semiconductor memory devices with a commonly shared data input/output bus and a processor which controls operations of the predetermined number of semiconductor memory devices with a clock signal, a read/write control signal and a chip selection control signal, wherein the predetermined number of devices respectively comprise: a predetermined number of groups of data input/output drivers for inputting data from outside and outputting the data to outside in response to an internal output control signal; control means for generating a first state of a first control signal in response to a first state of a clock signal of a following cycle when a clock signal, a read/write control signal and a chip selection control signal is inputted from outside to transmit a read command to a previous cycle and when a write or non-selection command is transmitted to a current cycle, and for generating a second state of a second control signal in response to the first state of the clock signal when a write or non-selection command is transmitted to the previous cycle and when a read command is transmitted to the current cycle; and a predetermined number of repeaters for controlling in groups the predetermined number of groups of data input/output drivers by generating an internal output control signal which shifts to the first state of the second control signal in response to the second state thereof and which shifts to the second state of the first control signal in response to the first state thereof, thereby rapidly transmitting an internal output control signal for controlling data output drivers and preventing data conflict on the data buses.

24 Claims, 10 Drawing Sheets

SEMICONDUCTOR MEMORY DEVICE AND SYSTEM

BACKGROUND OF THE INVENTION

1. Field of the Invention

The present invention relates to a semiconductor memory device and system, and more particularly to a semiconductor memory device which can make a progress in transmission of an internal control signal which might be delayed due to the load on a data line and which can prevent data conflict on a data bus when data is transmitted to the data bus located between semiconductor memory devices and a processor.

2. Description of the Related Art

A conventional semiconductor memory device generates an internal output control signal by inputting an output control signal from outside, transmits it to data output drivers connected to respective data input/output pins to enable or disable outputting of data. Therefore, the single internal output control signal is used as a control signal for a plurality of data output drivers.

In this case, the time for transmitting the internal output control signal is delayed because of the load on the data transmission line because the internal output control signal is transmitted to a plurality of data output drivers.

Accordingly, in case that the semiconductor memory device is operating at a low speed, a margin is sufficiently secured between the input/output data so that it can be negligible that the transmission of the internal output control signal is delayed. On the other hand, in case that the semiconductor memory device is operating at a high speed, a margin is not so sufficiently provided between the input/output data that it becomes impossible for the device to successfully drive at a high speed.

Furthermore, the system having the conventional semiconductor memory device is constructed with two semiconductor memory devices sharing a data bus and a processor. In the system, data is transmitted via the data bus when the two semiconductor memory devices are enabled or disabled by the processor.

When the system constructed with semiconductor memory devices sharing the data bus is operating at a low speed, the margin is provided between the input/output data transmitting on the data bus so sufficiently that data conflict may be available. However, when the system is operating at a high speed, the margin is not sufficiently secured between the input/output data transmitting on the data bus so that data conflict may happen.

In other words, in the operations to output data from the two semiconductor memory devices commonly connected to a data bus, after the data output driver completes transmitting data to the data output pin of the one semiconductor memory device and is disabled, but before the data inputted at the data bus is completely transmitted to the processor, if the data output driver is enabled to transmit data to the data output pin of the other semiconductor memory device and transmit the data to the commonly shared data bus, data conflict may happen on the data bus.

In order to solve the aforementioned problems, a technique titled "clocked logic circuitry preventing double driving on shared data bus" has been disclosed to add a dummy cycle at every time that the drivers driving the data bus are changed. In other words. That is, after the driver operated at the previous cycle is disabled, a dummy cycle is added to complete disabling the driver and to enable another driver operating at the current cycle. However, there is a disadvantage in the aforementioned method in that the additional dummy cycle lowers the efficiency of the data bus to make it impossible to apply at a system operating at a high speed.

Also, another technique titled "driver for tri-state bus" has been disclosed at U.S. Pat. No. 5,646,553 to solve the aforementioned problem. Data is transmitted to the data bus during the first half cycle of a clock signal, and the data is then kept there during the second half cycle thereof. However, there is also a problem in this method in that an additional consideration should be made in the course of designing the system to provide all the data buses with keepers which include latches to keep the transmitted data on the data buses.

The present invention is disclosed to solve the aforementioned problem as the data conflict on the shared data bus in the prior art is caused because there is only one internal output control signal for controlling the data output drivers of the semiconductor memory devices and because the single control signal simultaneously controls all the data output drivers connected to the data input/output pins, which increases the load on the data line so greatly as to slow down the speed of transmitting the control signal.

The aforementioned problems can also be solved by mismatching the size of transistors located on the path which generates the internal output control signal to thereby speed up the time for enabling or disabling the internal output control signal. However, if the time for enabling the internal output control signal is shortened, data conflict may happen on the system with the shared data bus. On the other hand, if the time for disabling the internal output control signal is shortened, it may be impossible to make the system operate at a high speed because the time for accessing data lags in spite of one advantage of preventing the data conflict on the shared data bus.

On the other hand, the time for enabling and disabling the internal output control signal can be shortened by using an identically big transistors on the path to generate the internal output control signal. However, in this case the size of all the transistors which generate the internal output control signal increases to proportionally influence on the switching current, and the increased current load slows down the speed of transmitting the signal more adversely than when the size of transistors is mismatched.

SUMMARY OF THE INVENTION

The present invention is disclosed to solve the aforementioned problems and it is an object of the present invention to provide a semiconductor memory device which can improve the speed to transmit an internal output control signal for controlling data output drivers.

It is another object of the present invention to provide a system having semiconductor memory devices which can prevent data conflict on a commonly shared data bus located between the semiconductor memory devices and a processor.

In order to accomplish the first object, the semiconductor memory device of the present invention comprises:
  at least two groups of data input/output drivers;
  a control circuit to generate first and second control signals in response to an externally-supplied clock signal, read/write control signal, and chip selection control signal, the control circuit asserting the first control signal when the externally-supplied signals indicate a read command for a current memory cycle and the externally-supplied signals indicated a write command or a non-selection command for the preceding memory cycle, the control circuit asserting the second control signal when the signals indicate a write command or a non-selection command for a current memory cycle and the control signals indicated a read command for the preceding memory cycle; and a repeater for each group of data input/output drivers, each repeater generating an internal output control signal for its driver group, the assertion of the internal output control signal responsive to the first control signal, and the deassertion of the internal output control signal responsive to the second control signal.

To achieve the second object of the present invention, a system comprises first and second semiconductor memory devices sharing a data input/output bus, and a processor that transmits a clock signal, a read/write control signal and a chip selection control signal to control operations of the first and second semiconductor memory devices, wherein each of the semiconductor memory devices comprises:

at least two groups of data input/output drivers;

a control circuit to generate first and second control signals in response to an externally-supplied clock signal, read/write control signal, and chip selection control signal, the control circuit asserting the first control signal when the externally-supplied signals indicate a read command for a current memory cycle and the externally-supplied signals indicated a write command or a non-selection command for the preceding memory cycle, the control circuit asserting the second control signal when the signals indicate a write command or a non-selection command for a current memory cycle and the control signals indicated a read command for the preceding memory cycle; and a repeater for each group of data input/output drivers, each repeater generating an internal output control signal for its driver group, the assertion of the internal output control signal responsive to the first control signal, and the deassertion of the internal output control signal responsive to the second control signal.

In another aspect of the present invention, a semiconductor memory device is disclosed that comprises:

at least two data input/output drivers; and a driver control circuit to generate an output control signal for the data input/output drivers in response to externally-supplied chip control signals, the driver control circuit comparing the command represented by the externally-supplied chip control signals for the current and the last memory cycles and delaying the assertion of the output control signal by at least a first preset interval following a clock signal when the current command is a read command and the last command was a write command or a non-selection command.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF THE INVENTION

A conventional semiconductor memory device and a system thereof of the present invention are described in detail with reference to the accompanying drawings.

Figure 1:
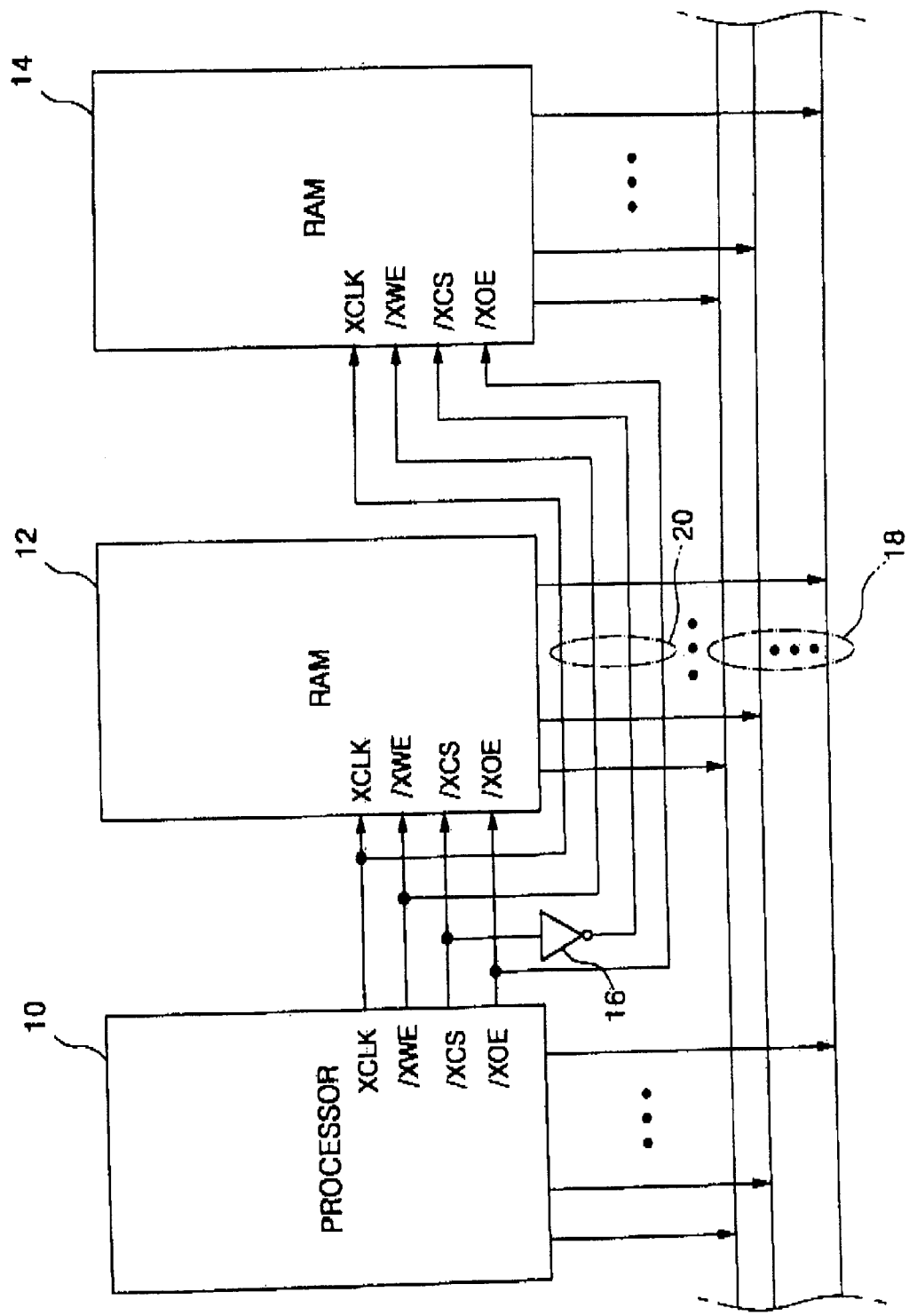
FIG. 1 is a block diagram for illustrating a system having conventional semiconductor memory devices sharing a data bus.

FIG. 1 is a block diagram for illustrating a system having conventional semiconductor memory devices sharing a data bus, comprising a processor 10, semiconductor memory devices 12, 14, an inverter 16, a data bus 18, a control bus 20.

The operational procedures to input/output data are described below.

The processor 10 applies control signals such as a clock signal XCLK, an inverse write enable signal /XWE and an inverse chip selection signal /XCS to the semiconductor memory devices 12, 14 to transmit data to the data bus 16 or to input the data transmitted to the data bus 16. The semiconductor memory device 12 is enabled in response to a low level of the inverse chip selection signal /XCS sent from the processor 10 to transmit data to the data bus 16 in response to the clock signal XCLK and the inverse write enable signal /XWE or to input the data transmitted to the data bus 16. The semiconductor memory device 14 is enabled in response to a high level of the inverse chip selection signal /XCS sent from the processor 10 to transmits data to the data bus 16 in response to the clock signal XCLK and the inverse write enable signal /XWE or to input the data transmitted to the data bus 16.

Figure 2:
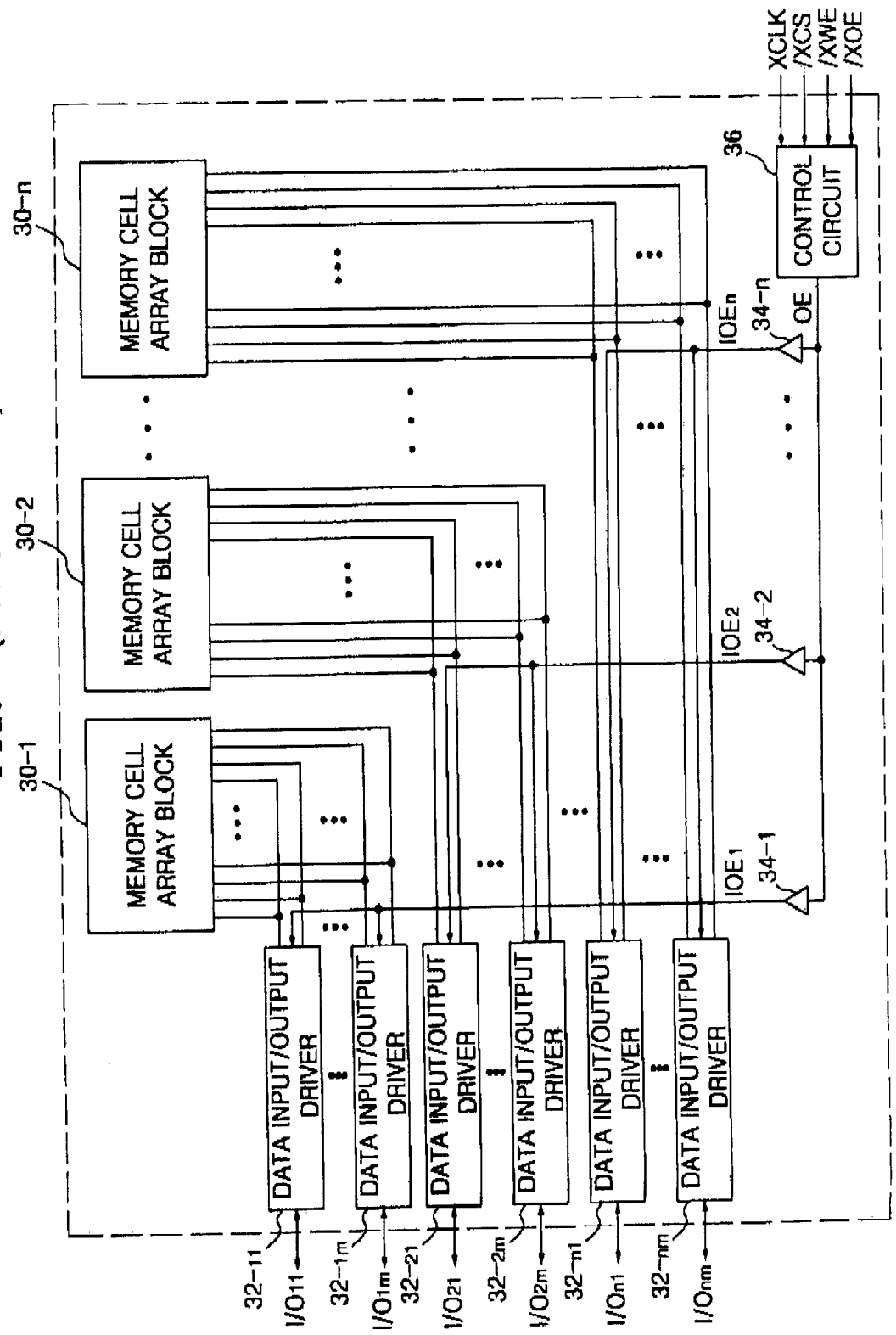
FIG. 2 is a block diagram for illustrating an internal circuit of a conventional semiconductor memory device.

FIG. 2 is a block diagram for illustrating an internal circuit of a conventional semiconductor memory device, comprising n memory cell array blocks 30-1, 30-2, . . . , 30-n, n groups of m data input/output drivers (32-11, . . . , 32-1m), (32-21, . . . , 32-2m), . . . , (32-n1, . . . , 32-nm), a control circuit 36 and n driving circuits 34-1, 34-2, . . . , 34-n). The block indicated by a dotted line in FIG. 2 shows an internal part of the semiconductor memory device.

The functions of the respective blocks thus constructed are described below.

The data input/output drivers (32-11, . . . , 32-1m), (32-21, . . . , 32-2m), 32-n1, . . . , 32-nm) are respectively connected to the m data input/output lines of the memory cell array blocks 30-1, 30-2, . . . , 30-n to input/output data.

The control circuit 36 inputs the control signals XCLK, /XCS, /XWE, /XOE sent from outside to generate one internal output control signal which enables or disables the n groups of the m data input/output drivers. The n driving circuits 34-1, 34-2, . . . , 34-n generate control signals IOE1, IOE2, . . . , IOEn to control the n groups of the m data input/output drivers in response to the internal output control signal OE sent from the control circuit 36.

Figure 3:
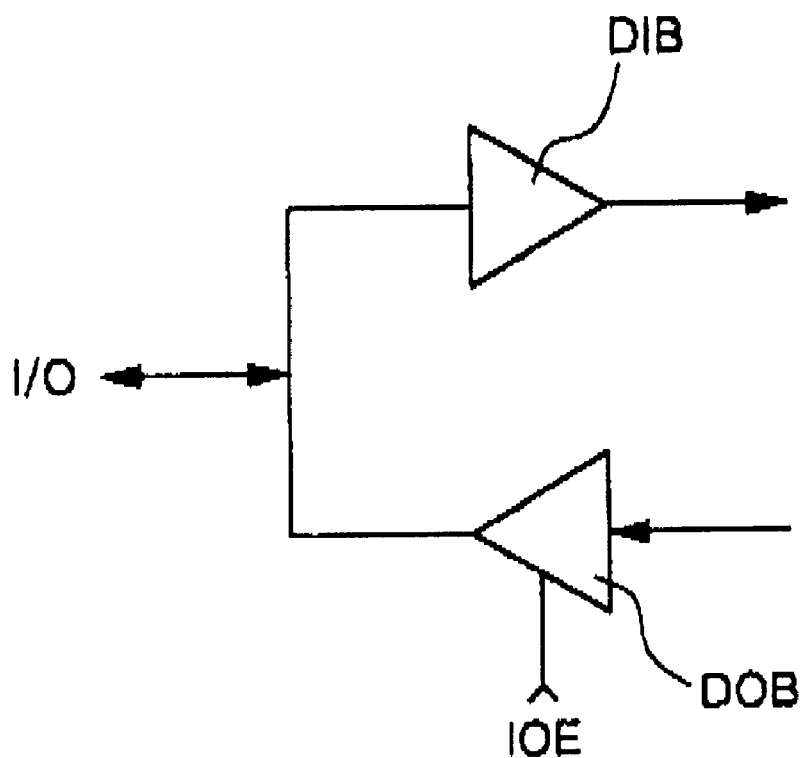
FIG. 3 illustrates the structure of the data input/output driver shown in FIG. 2.

FIG. 3 illustrates a structure of the data input/output driver shown in FIG. 2, comprising a data input buffer DIB and a data output buffer DOB.

The data input buffer DIB buffers the data input signal inputted from outside to transmit to the data line. The data output buffer DOB buffers the data transmitted on the data line in response to the high level of the control signal IOE to output to outside and generates a high impedance state of an output signal in response to the low level of the control signal IOE. Thus, the data output buffer DOB is constructed with three states thereof.

Figure 4:
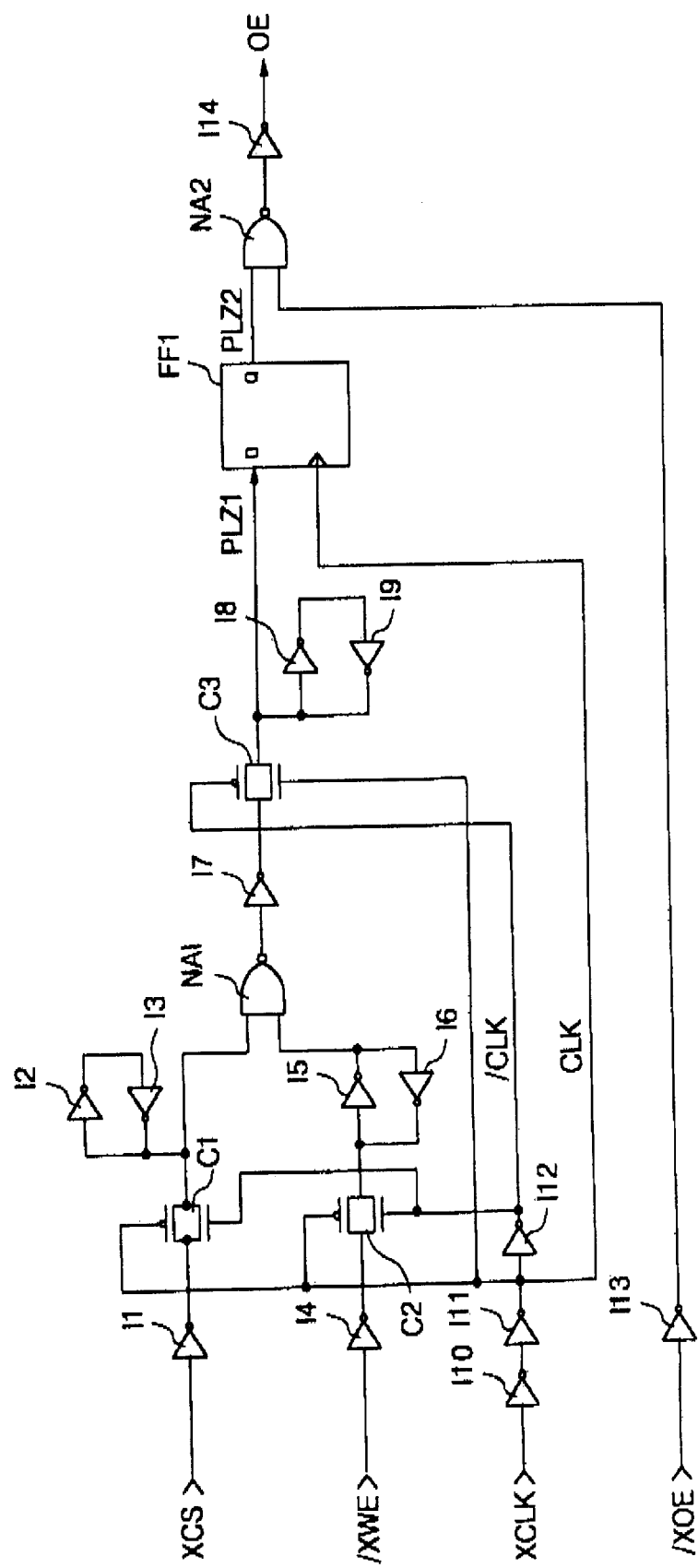
FIG. 4 is a circuit diagram for illustrating an embodiment of the control circuit shown in FIG. 2.

FIG. 4 is a circuit diagram for illustrating an embodiment of a control circuit shown in FIG. 2, comprising inverters I1–I14, CMOS transmission gates C1–C3, NAND gates NA1, NA2, and D flip flop FF1.

The operational procedures of the control circuit thus constructed are described below.

In reading data, when a low level of the inverse chip selection signal /XCS, a high level of the inverse write enable signal /XWE, a clock signal XCLK and a low level of the inverse output control signal /XOE are respectively transmitted, the inverters I10, I11 buffer the clock signal XCLK to output the clock signal CLK. The inverter I12 inverts the clock signal CLK to output the inverse clock signal /CLK. The inverters I1, I4 invert the low level of the inverse chip selection signal /XCS and the high level of the inverse write enable signal /XWE to respectively generate the high and low levels thereof.

The CMOS transmission gates C1, C2 are turned on in response to the low level of the clock signals to respectively transmit the high and low levels thereof. The latch having inverters I2, I3 latches the high level of the output signal of the CMOS transmission gate C1. The latch having inverters I5, I6 latches the low level of the output signal of the CMOS transmission gate C2. NAND gate NA1 and the inverter I7 AND (logically multiply) the high level of the output signals of the CMOS transmission gate C1 and of the inverter I5 to generate the high level of the signal. The CMOS transmission gate C3 transmits the high level of the signal in response to the high level of the clock signal CLK. The latch having inverters I8, I9 latches the high level of the output signal of the CMOS transmission gate C3.

D flip flop FF1 latches the high level of the signal PLZ1 of the CMOS transmission gate C3 in response to the low level of the clock signal CLK and outputs the high level of the signal PLZ1 in response to the high level of the clock signal CLK. That is, D flip flop FF1 outputs the signal PLZ1 after delaying one cycle thereof. NAND gate NA2 and the inverter I14 generate the high level of the output control signal OE.

In writing data, when a low level of the inverse chip selection signal /XCS, a low level of the inverse write enable signal /XWE, and a clock signal XCLK are respectively transmitted, the inverters I1, I4, invert the low levels of the inverse chip selection signal /XCS and the inverse write enable signal /XWE to respectively generate high levels thereof.

The CMOS transmission gates C1, C2 are turned on in response to the low level of the clock signals to respectively transmit high level thereof. The latch having inverters I2, I3 latches the high level of the output signal outputted by the CMOS transmission gate C1. The latch having inverters I5, I6 latches the high level of the output signal outputted by the CMOS transmission gate C2. NAND gate NA1 and the inverter I7 AND (logically multiply) the high level of the output signal of the CMOS transmission gate C1 and the low level of the output signal of the inverter I5 to generate the high level of the signal. The CMOS transmission gate C3 generates the low level of the signal PLZ1 in response to the high level of the inverse clock signal /CLK. The latch having inverters I8, I9 latches the output signal of the CMOS transmission gate C3.

D flip flop FF1 outputs the signal PLZ2 after delaying one cycle of the low level of the signal PLZ1, NAND gate NA2 and the inverter I14 generate the low level of the output control signal OE.

In non-selecting data, high level of the inverse chip selection signal /XCS and the clock signal XCLK are transmitted from outside. In this case the D flip flop FF1 latches the low level of the signal just as in writing data, and generates the low level of the output control signal OE at the following cycle.

In reading data, the inverse output control signal /XOE inputted from outside turns to the low level thereof. In writing or non-selecting data, the inverse output control signal /XOE turns to low or high levels thereof. That is, the low level of the output control signal OE is generated in writing and non-selecting data regardless of the state of the inverse output control signal /XOE.

Figure 5:
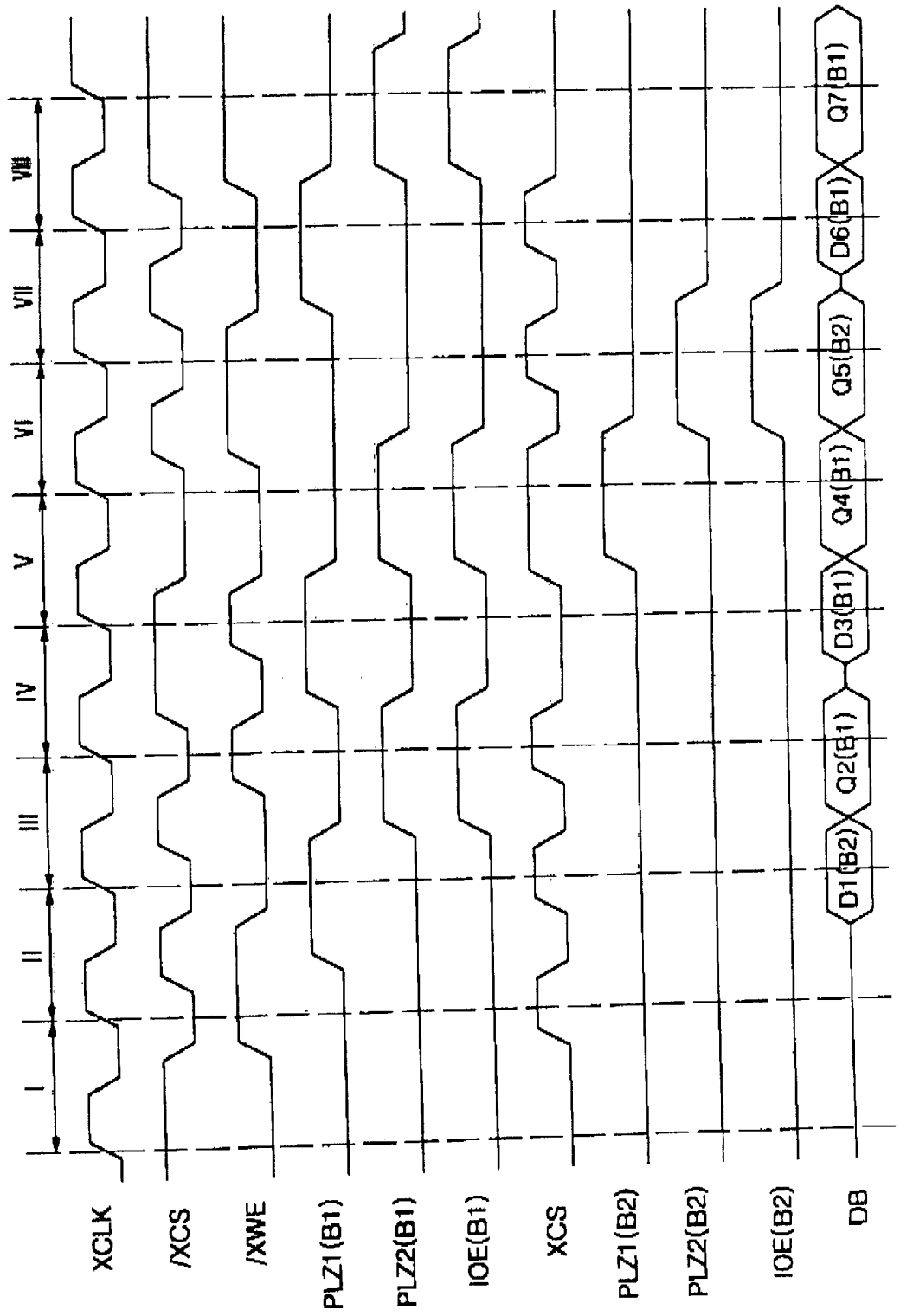
FIG. 5 is an operational timing diagram for illustrating operational procedures of the semiconductor memory device shown in FIG. 2 in case that it is applied to the system in FIG. 1.

FIG. 5 is an operational timing diagram for illustrating operational procedures of the semiconductor memory device in FIG. 2 in case that it is applied to the system in FIG. 1. The operational procedures are described in cycle below. In the operational timing diagram in FIG. 5, the references indicated by B1 and B2 in FIG. 1 are respectively the signals internally generated in the RAMs 12, 14.

In the first cycle (I), as in FIG. 1, at the rising edge of the clock signal, if the high and low levels of the inverse chip selection signals /XCS are respectively transmitted to the RAMs 12, 14 and if the low level of the inverse write enable signal /XWE is transmitted, the control signals OEs (B1), (B2) of the control circuits 36 of the RAMs 12, 14 turn to the low levels thereof to make the low level of the internal output control signals IOE (B1), IOE (B2). That is, a non-selection command is transmitted to the RAM 12, and a write command is transmitted to the RAM 14.

In the second cycle II, at the rising edge of the clock signal XCLK, if the low and high levels of the inverse chip selection signals /XCSs are respectively transmitted to the RAMs 12, 14 and if the high level of the inverse write enable signal /XWE is transmitted, the signal PLZ1 (B1) of the control circuit 36 of the RAM 12 turns to the high level thereof. Also the write data D1 (B2) is inputted by the data bus (DB) to the RAM 14.

In the third cycle III, at the rising edge of the clock signal XCLK, if the low and high levels of the inverse chip selection signals /XCSs are respectively transmitted to the RAMs 12, 14, and if the low level of the inverse write enable signal /XWE is transmitted, the signal PLZ1 (B1) of the control circuit 36 of the RAM 12 shifts to the low level thereof, and the signal PLZ2 (B1) shifts to the high level thereof after one cycle of the signal PLZ1 (B1) is delayed. Therefore, the output control signal OE (B1) of the control circuit 36 of the RAM 12 shifts to the high level thereof in response to the signal PLZ2 (B1) to make the internal output control signal IOE (B1) shift to the high level thereof. Thus, the data Q2 (B1) stored at the RAM 12 is outputted to the data bus DB in response to the internal output control signal IOE (B1).

In the fourth cycle IV, at the rising edge of the clock signal XCLK, if the low and high levels of the inverse chip selection signals /XCSs are respectively transmitted to the RAMs 12, 14, and if the high level of the inverse write enable signal /XWE is transmitted to the RAMs 12, 14, the signal PLZ1 (B1) of the control circuit 36 of the RAM 12 shifts to the high level thereof and the signal PLZ2 (B2) shifts to the low level thereof. And, the write data D3 (B1) is inputted to the RAM 12 by the data bus DB.

In the fifth cycle V, at the rising edge of the clock signal XCLK, if the high and low levels of the inverse chip selection signals /XCSs are respectively transmitted to the RAMs 12, 14, and if the high level of the inverse write enable signal /XWE is transmitted, the signals PLZ1 (B1) and PLZ2 (B2) of the control circuit 36 of the RAM 12 respectively shift to the low and high levels thereof, so that the internal output control signal IOE (B1) shifts to the high level thereof. And the signal PLZ1 (B1) of the control circuit 36 of the RAM 14 turns to the high level thereof. Thus, the data Q4 (B1) is outputted to the data bus DB in response to the internal output control signal IOE (B1).

In the sixth cycle VI, at the rising edge of the clock signal XCLK, if the low and high levels of the inverse chip selection signals /XCSs are respectively transmitted to the RAMs 12, 14 and if the low level of the inverse write enable signal /XWE is transmitted, the signals PLZ2 (B1) and PLZ1 (B2) of the control circuits 36 of the RAMs 12, 14 respectively shift to the low levels thereof and the signal PLZ2 (B2) shifts to the low level thereof. Thus, the RAM 14 transmits the data Q5 (B2) to the data bus DB in response to the high level of the internal output control signal IOE (B1).

In the seventh cycle VII, a control signal identical to that in the fourth cycle IV is transmitted to perform the same operations. The RAM 12 writes the write data D6 (B1) which is being transmitted by the data bus DB.

In the eighth cycle VIII, a control signal identical to that in the fifth cycle V is transmitted to perform the same operations. The data Q7 (B1) stored at the RAM 12 is outputted to the data bus DB.

When the conventional system thus constructed operates at a low speed, the write, read and non-selection operations are performed so slowly that the data conflict will not happen on the data bus DB.

However, if the aforementioned system operates at a high speed, the data conflict may happen on the data bus DB. As soon as one data output driver of the semiconductor memory device 12 connected to the data output pin of the data bus DB shared by the semiconductor devices 12, 14 is disabled to transmit the data to the data bus 18, another data output driver of the semiconductor memory device 14 is enabled to transmit the data to the data bus DB 18 even before the data sent from the first data output driver of the semiconductor memory device 12 is not completely transmitted to the processor 10.

As shown in the timing diagram in FIG. 5, if the margin is not sufficiently secured between the write data D1 (B2) and the read data Q2 (B1), the data conflict may be caused on the data bus.

If the system operates at a low speed, the data conflict may be avoided by delaying the time to shift the internal output control signal OE (B1) to the high level thereof. On the other hand, if the aforementioned method is applied to the system operating at a high speed, the time to shift the internal output control signal OE (B1) to the high level thereof is delayed to negatively influence on the time to output data. Therefore, it is impossible to make the system operate at a high speed.

In other words, if the system operates at a high speed, the time taken between two operations of reading and writing data and that taken between two data reading operations are gradually shortened to cause data conflict.

Figure 6:
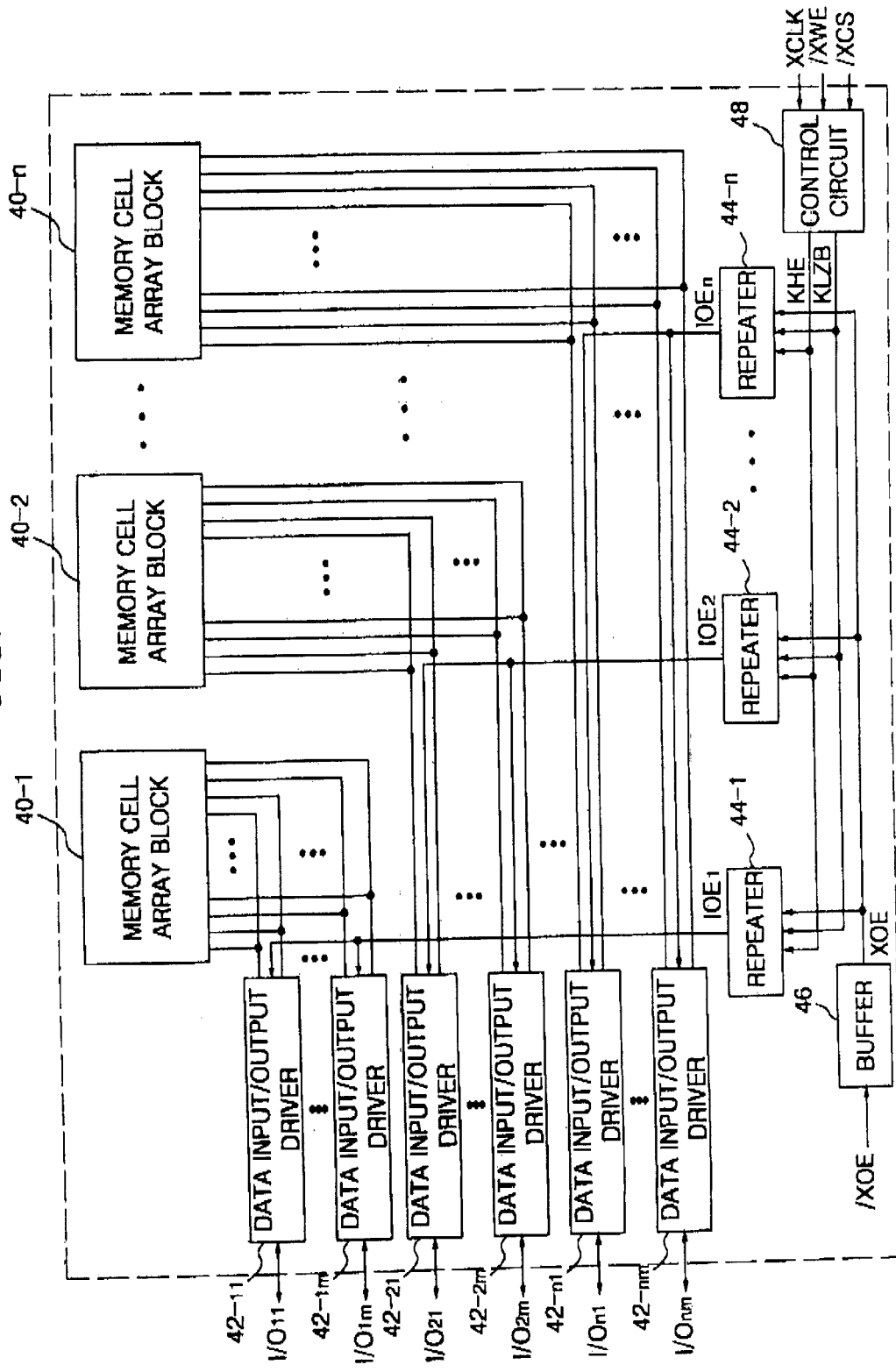
FIG. 6 is a block diagram for illustrating an internal circuit of the semiconductor memory device in accordance with the present invention.

FIG. 6 is a block diagram for illustrating an internal circuit of the semiconductor memory device in accordance with the present invention, comprising n memory cell array blocks 40-1, 40-2, ..., 40-n, n groups of m data input/output drivers (42-11, ..., 42-1m), (42-21, ..., 42-2m), ..., (42-n1, ..., 42-nm), n repeaters 44-1, 44-2, ..., 44-n), XOE buffer 46 and a control circuit 48. The block indicated by a dotted line in FIG. 6 shows the internal part of the semiconductor memory device.

The functions of the respective blocks thus constructed are described below.

The data input/output drivers (42-11, ..., 42-1m), (42-21, ..., 42-2m), (42-n1, ..., 42-nm) are respectively connected to the m data input/output lines of the memory cell array blocks 40-1, 40-2, ..., 40-n to input/output data. The control circuit 48 inputs the control signals XCLK, /XCS, /XWE, /XOE inputted from outside to generate internal output control signals KHZ, KLZB for controlling the n groups of the m data input/output drivers. XOE buffer 46 buffers the inverse output control signal /XOE to generate a control signal XOE. The repeaters 44-1, 44-2, ..., 44-n respectively input the output signals KHZ, KLZB and the control signal XOE of the control circuit 48 to generate control signals IOE1, IOE2, ..., IOEn.

Figure 7:
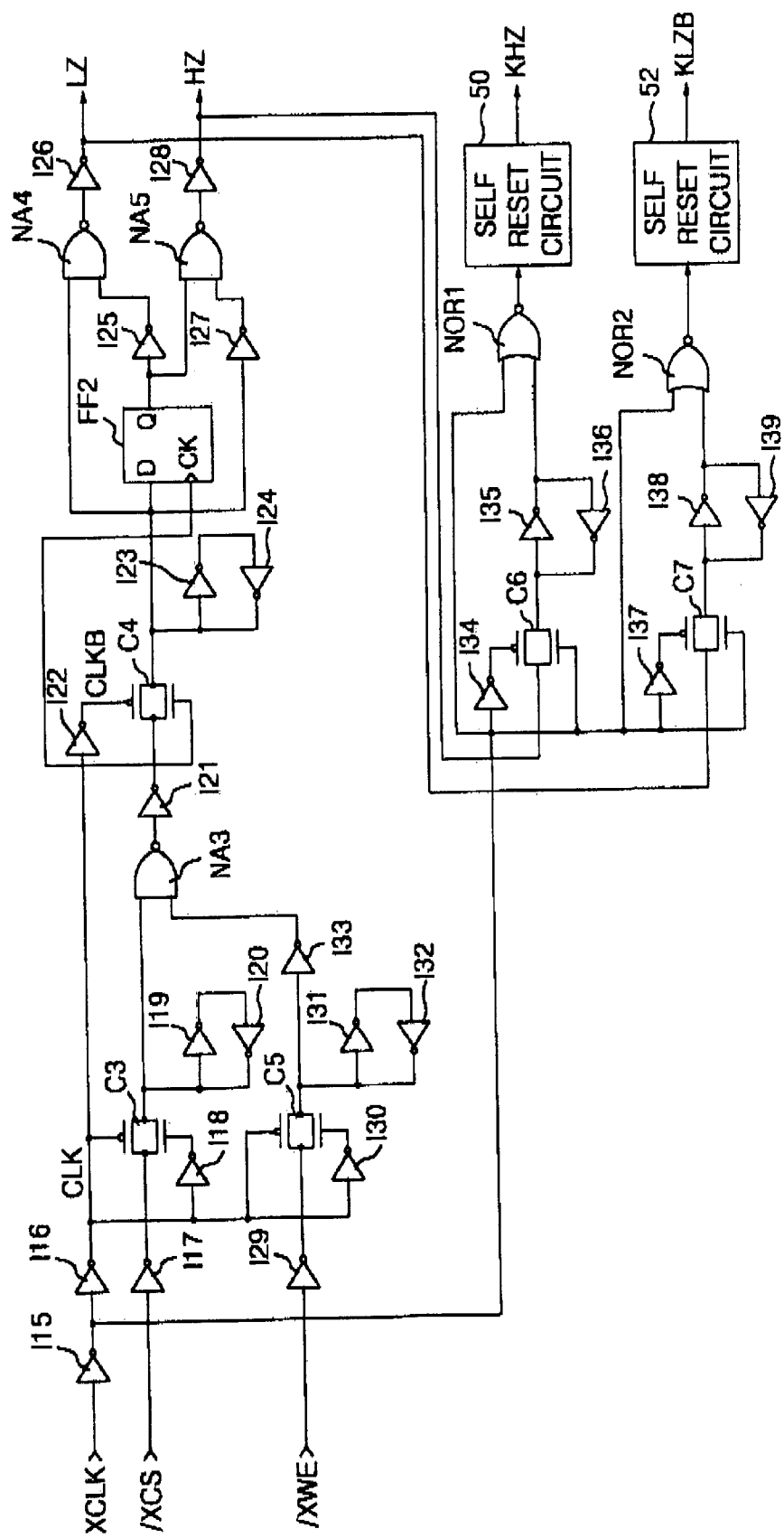
FIG. 7 is a circuit diagram for illustrating an embodiment of a control circuit in accordance with the present invention.

FIG. 7 is a circuit diagram illustrating an embodiment of the control circuit 48 shown in FIG. 6, comprising inverters I15–I39, CMOS transmission gates C4–C8, NAND gates NA3–NA5, NOR gates NOR1, NOR2, D flip flop FF2 and self reset circuits 50, 52.

The operational procedures of the control circuit thus constructed are described below.

The control circuit 48 shown in FIG. 7 generates a signal HZ when the read command is transmitted at the previous cycle and then the write or non-selection command is transmitted at the current cycle. When the write command or non-selection command is transmitted at the previous cycle and when the read command is transmitted at the current cycle, the control circuit 48 generates a signal LZ.

At the current cycle, when a low level of the inverse chip selection signal /XCS, a high level of the inverse write enable signal /XWE, and a clock signal XCLK are transmitted, the inverters I15, I16 buffer the clock signal XCLK to output the clock signal CLK. The inverters I17, I29 invert the inverse chip selection signal /XCS and the inverse write enable signal /XWE to respectively generate the high and low levels thereof.

The CMOS transmission gates C4, C5 respectively transmit the high and low levels of the signals in response to the low level of the clock signal. The latch having inverters I19, I20 latches the high level of the signal. The latch having inverters I31, I32 latches the low level of the signal. The inverters I33 inverts an output signal of the CMOS transmission gate C5 to generate a high level thereof. NAND gate NA3, and the inverter I21 generate the high level of the signals. The CMOS transmission gate C8 transmits the high level of the output signal of the inverter I21 in response to the high level of the clock signal CLK. The inverter I27 inverts the high level of the output signal of the CMOS transmission gate C8 to generate the low level thereof. NAND gate NA5 and the inverter I28 generate the low level of the signal HZ.

D flip flop FF2 outputs the high or low level of the signal latched at the previous cycle in response to the rising edge of the clock signal CLK. The inverter I25 inverts the high or low level of the signal to generate the low or high level thereof. NAND gate NA4 and the inverter I26 generate the low or high level of the signal LZ. Thus, if the signal latched at the D flip flop FF2 is the high level thereof, the low level of the signal LZ is generated. And if it is the low level thereof, the high level of the signal LZ is generated.

If the write command or non-selection command is transmitted to latch the low level of the signal to the D flip flop FF2 at the previous cycle and if the read command is transmitted at the current cycle, the high level of the signal LZ is generated. Furthermore, if the read command is transmitted to latch the high level of the signal to the D flip flop FF2 at the previous cycle and if the read command is transmitted at the current cycle, the low level of the signal LZ is generated. The low level of the signal LZ generated in the aforementioned procedures shifts to the low level thereof in response to the rising edge of the clock signal at the following cycle.

If the low level of the inverse write enable signal /XWE and the clock signal XCLK are respectively transmitted at the current cycle, the inverters I17, I29 invert the low level of the inverse chip selection signal /XCS and the inverse write enable signal /XWE to respectively generate high level thereof.

The CMOS transmission gates C4, C5 respectively transmit high level of the clock signals in response to the low level thereof. The latch having inverters I19, I20 latches the high level of the signal outputted by the CMOS transmission gate C4. The latch having inverters I31, I32 latches the high level of the output signal outputted by the CMOS transmission gate C5. The inverter I33 inverts the high level of the signal outputted by the CMOS transmission gate C5 to generate the low level thereof. NAND gate NA3 and the inverter I21 input the high and low levels of the output signals of the CMOS transmission gate C4 and the inverter I33 to generate the low level of the signal. The CMOS transmission gate C8 transmits the low level of the signal outputted by the inverter I21 in response to the low level of the inverse clock signal CLKB. The latch having inverters I23, I24 latches the low level of the signal.

D flip flop FF2 outputs the low or high level of the signal latched in response to the rising edge of the clock signal CLK. The inverter I25 inverts the low or high level of the signal to generate the high or low level thereof. The inverter I27 inverts the low level of the signal to generate the high level thereof. NAND gate NA4 and the inverter I26 respectively generate the low and high level of the signals LZ, HZ if the data latched at the D flip flop FF2 at the previous cycle is the low and high level thereof.

If the read command is transmitted to latch the high level of the signal to the D flip flop FF2 at the previous cycle and if the write command is transmitted to the current cycle, the high level of the signal HZ is generated. Furthermore, the high level of the signal HZ generated in the aforementioned procedures shifts to the low level thereof in response to the rising edge of the clock signal CLK at the following cycle.

At the current cycle, when a high level of the inverse chip selection signal /XCS, a high or low level of the inverse write enable signal /XWE, and a clock signal XCLK are respectively transmitted, the inverter I17 inverts the high level of the inverse chip selection signal /XCS to generate the low level thereof.

The CMOS transmission gate C4 transmits the low level of the signal in response to the low level of the clock signal CLK. The latch having inverters I19, I20 latches the low level of the output signal of the CMOS transmission gate C4. NAND gate NA3 and the inverter I21 generate the low level thereof in response to the low level of the output signal of the CMOS transmission gate C4 regardless of the output signal of the inverter 33. The CMOS transmission gate C8 transmits the low level of the signal in response to the high level of the clock signal CLK. The inverter I27 inverts the low level of the output signal of the CMOS transmission gate C8 to generate the high level thereof.

D flip flop FF2 generates the high or low level of the signal latched at the previous cycle in response to the clock signal CLK. NAND gate NA4 and the inverter I26 generate the low level of the signal LZ. The NAND gate NA5 and the inverter I28 respectively generate the high and low level of the signals HZ, LZ if the output signals of the D flip flop FF2 are the high and low level thereof.

If the read command is transmitted to latch the high level of the signal to the D flip flop FF2 at the previous cycle and if the non-selection command is transmitted at the current cycle, the high level of the signal HZ is generated. The high level of the signal HZ generated in the aforementioned manner shifts to the low level thereof in response to the rising edge of the clock signal at the following cycle.

Next, the operational procedures of generating the signals KHZ, KLZB by inputting the signals HZ, LZ are described below.

The CMOS transmission gate C6 transmits the high or low level of the signal HZ or LZ in response to the rising edge of the clock signal CLK. The latch having inverters I35, I36 inverts and latches the high or low level of the signal outputted from the CMOS transmission gate C6 to generate the low or high level thereof. NOR gate NOR1 generates the low or high level thereof by inverting the high or low level of the signal latched at the inverters I35, I36 in response to the high level of the clock signal CLK.

In other words, the signal HZ latched at the previous cycle inverts to generate the signal KHZ at the current cycle in response to the high level of the clock signal CLK. And the signal LZ latched at the previous cycle inverts to generate a signal KLZB at the current cycle in response to the high level of the clock signal CLK.

Figure 8A:
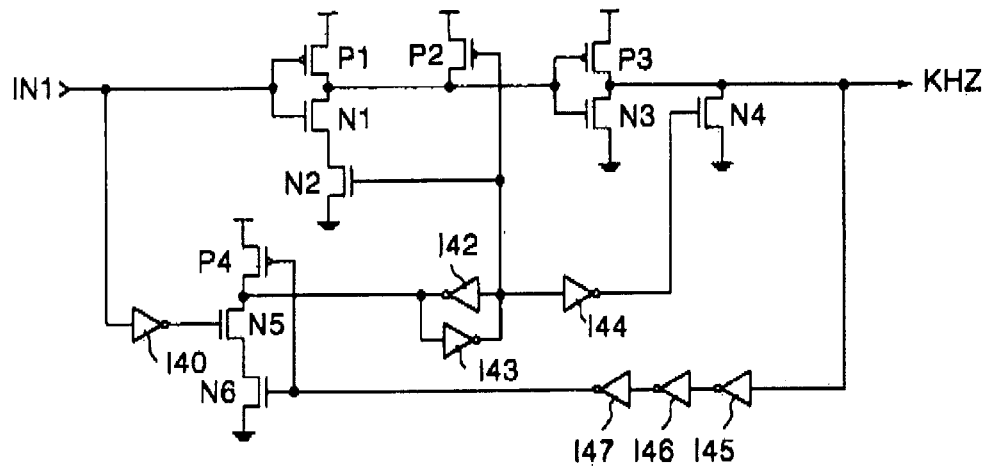
FIGS. 8a and 8b are circuit diagrams for illustrating an embodiment of a self reset circuit shown in FIG. 7.

FIG. 8a is a circuit diagram for illustrating an embodiment of the self reset circuit 50 shown in FIG. 7, comprising inverters I40, I42–I47, PMOS transistors P1–P4 and NMOS transistors N1–N6. In FIG. 7, PMOS transistors P2, P3 are big while a PMOS transistor P1 is small. NMOS transistors N1, N2, N3, N4 are big while a NMOS transistor N3 is small.

The operational procedures illustrated in FIG. 8a are described below.

While the output signal KHZ is kept at a low level thereof, the latch having inverters I42, I43 generates the high level of the signal. Then, NMOS N2 turns on, and the inverter I44 generates the low level of the signal. Therefore, the stand-by state is made for inputting the output signal IN1 of the NOR gate NOR1.

In this stand-by state, if the low level of the output signal IN1 of the NOR gate NOR1 is inputted, the PMOS transistor P1 turns on to output the high level of the signal to the drain of the PMOS transistor P1. Then, the NMOS transistor N3 turns on to generate the low level of the signal KHZ.

Furthermore, in the stand-by state, the high level of the output signal IN1 gate NOR1 is inputted, the NMOS transistor N1 turns on to output the low level of the signal to the drain of the NMOS transistor N1. Accordingly, the PMOS transistor P3 turns on to generate the high level of the signal KHZ. The high level of the signal KHZ generated in the aforementioned way is delayed and inverted in the course of passing the inverters I45, I46, I47 to generate the low level of the signal. The PMOS transistor P4 turns on to output the high level of the signal to the drain of the PMOS transistor P4. The latch having inverters I42, I43 inverts and latches the high level of the signal to generate the low level thereof. Then, the PMOS transistor P2 turns on, and the inverter I44 generates the high level of the signal. As a result, the NMOS transistor N4 turns on, and the output signal KHZ shifts to the low level thereof.

That is, if the output signal KHZ is kept at the low level thereof in the beginning of the operation and if the output signal IN1 of the NOR gate NOR1 is at the low level thereof, it will be kept low. On the other hand, if the output signal IN1 of the NOR gate NOR1 is shifted to the high level thereof, the high level of the signal will be reset to the low level thereof in a predetermined time of the period.

The NMOS transistors N1, N2 and PMOS transistor P3 constructed in FIG. 8a are large enough to rapidly shift the output signal KHZ to the high level thereof, as the output signal of the NOR gate NOR1 is shifted to the high level thereof. Also, the PMOS transistor P2 and the NMOS transistor N4 are large so as to rapidly shift the output signal KHZ to the low level thereof.

Figure 8B:
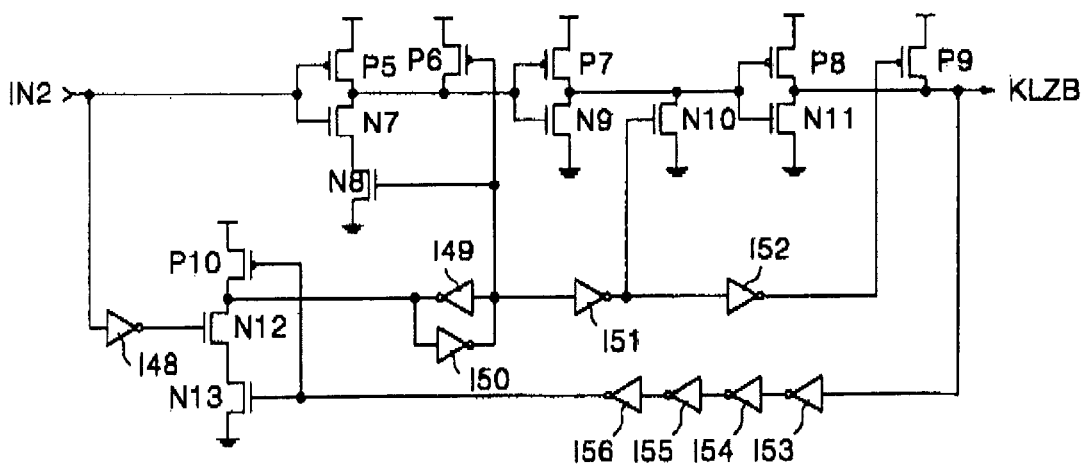

FIG. 8b is a circuit diagram for illustrating an embodiment of the self reset circuit 52 shown in FIG. 7, comprising inverters I48–I56, PMOS transistors P5–P10 and NMOS transistors N7–N13. In FIG. 8b, the PMOS transistors P5, P8 are small, but the PMOS transistors P6, P7, P9 are big. In addition, the NMOS transistor N9 is small, but NMOS transistors N7, N8, N10, N11 are big.

The operational procedures of the circuit shown in FIG. 8b are described below.

While the output signal KLZB is kept at a high level thereof, the inverters I53, I54, I55, I56 delay and generate the high level of the signal. The latch having inverters I49, I50 generates the high level of the signal. Then, NMOS transistor N8 turns on, and the inverters I51, I52 respectively generate the low and high levels of the signal, to thereby turn off the NMOS transistor N10 and PMOS transistor P9. Therefore, the stand-by state is made for inputting the output signal IN2 of the NOR gate NOR2.

In this stand-by state, if the low level of the output signal IN2 of the NOR gate NOR2 is inputted, the PMOS transistor P5 turns on to output the high level of the signal to the drain of the PMOS transistor P5. Then, the NMOS transistor N9 turns on to output the low level of the signal to the drain of the NMOS transistor N9. In addition, the PMOS transistor P8 turns on to generate the high level of the signal to the drain of the PMOS transistor P8, thereby making the high level of the output signal KLZB.

Furthermore, in the stand-by state, the high level of the output signal IN2 of the NOR gate NOR2 is inputted, the NMOS transistor N7 turns on to output the low level of the signal to the drain of the NMOS transistor N7. Accordingly, the PMOS transistor P7 turns on to output the high level of the signal to the drain of the PMOS transistor P7, and the NMOS transistor N11 turns on to output the low level of the signal to the drain of the NMOS transistor N11, thereby making the low level of the output signal KLZB. The low level of the signal KLZB generated in the aforementioned way is delayed in the course of passing the inverters I53, I54, I55, I56 to generate the low level of the signal. Then, the PMOS transistor P10 turns on to output the high level of the signal to the drain of the PMOS transistor P10. The latch having inverters I49, I50 inverts and latches the high level of the signal to generate the low level thereof. Then, the output signal of the inverters I51, I52 respectively shift to the high and low levels thereof. Therefore, the PMOS transistor P6, NMOS transistor N10, and the PMOS transistor P9 turn on to reset the output signal KLZB at the high level thereof.

That is, while the circuit shown in FIG. 8b is reset at the low level thereof in the initial state of the operation, if the output signal IN2 of the NOR gate NOR2 shifts to the high level thereof, it will generate the low level of the output signal KLZB. Then, the output signal KLZB will shift to the high level thereof in a predetermined period of time after it has shifted to the low level thereof. And if the output signal IN2 of the NOR gate NOR2 shifts to the low level thereof, the output signal is kept at the high level thereof.

The NMOS transistors N7, N8, the PMOS transistor P7 and the NMOS transistor N11 in FIG. 8b are constructed big enough to rapidly shift the output signal KLZB to the low level thereof. The PMOS transistors P6, P9 and the NMOS transistor N10 are big, so as to rapidly shift the output signal KLZB to the high level thereof.

Figure 9:
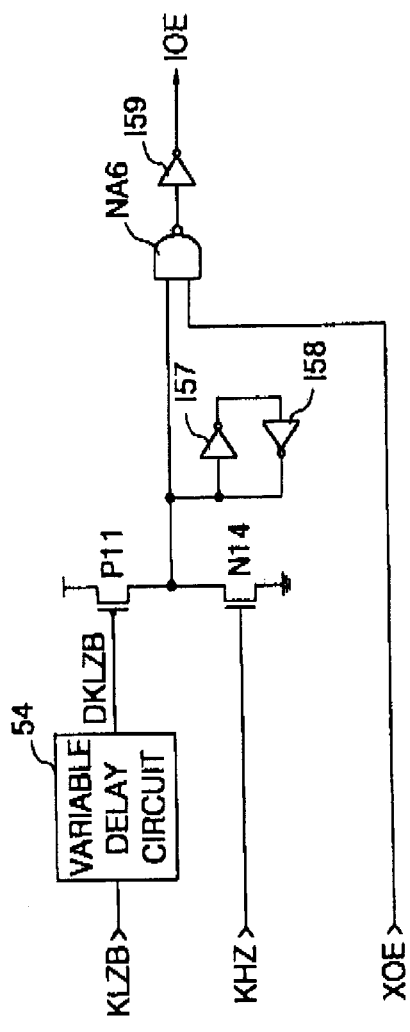
FIG. 9 is a circuit diagram for illustrating an embodiment of repeaters shown in FIG. 7.

FIG. 9 is a circuit diagram for illustrating an embodiment of the repeaters 44-1, . . . , 44-n shown in FIG. 7, each comprising a variable delay circuit 54, a PMOS transistor P11, a NMOS transistor N14, inverters I57, I58, I59, and a NAND gate NA6.

The operational procedures of the circuit shown in FIG. 9 are described below.

The variable delay circuit 54 delays and outputs the signal KLZB. The PMOS transistor P11 outputs the high level of the signal to the drain of the PMOS transistor P1 in response to the low level of the output signal DKLZB of the variable delay circuit 54. The NMOS transistor N14 generates the low level of the signal in response to the high level of the signal KHZ. The latch having inverters I57, I58 latches the signal outputted through a common drain of the PMOS transistor P11 and NMOS transistor N14. In reading data, the NAND gate NA6 and the inverter I59 generate an internal output control signal IOE by using the signal outputted through the common drain of the PMOS transistor P11 and the NMOS transistor N14 in response to the high level of the output control signal XOE. On the other hand, in writing or non-selecting data, they generate an internal output control signal IOE in response to the high or low level of the output control signal XOE. In other words, the output control signal XOE respectively turns to the high level thereof in reading data and to the high or low level thereof in writing or non-selecting data, thereby inputting to the NAND gate NA6 and the inverter I59.

The circuit shown in FIG. 9 generates the internal output control signal IOE that shifts to the high level thereof in response to the signal KLZB and that shifts to low level thereof in response to the signal KHZ. The internal output control signal IOE is delayed by the variable delay circuit for a predetermined period of time before it shifts to the high level thereof.

Figure 10:
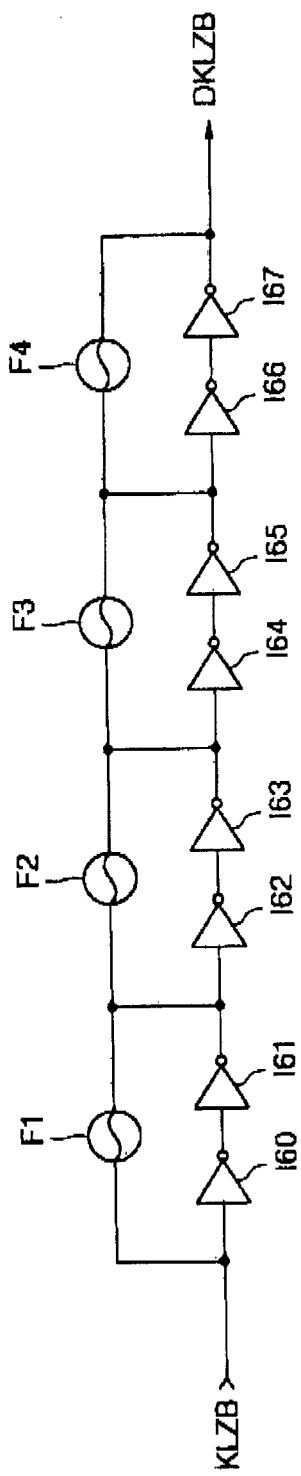
FIG. 10 is a circuit diagram for illustrating an embodiment of a variable delay circuit shown in FIG. 9.

FIG. 10 is a circuit diagram for illustrating an embodiment of the variable delay circuit 54 shown in FIG. 9, comprising inverters I60–I67 and fuses F1–F4.

The inverters I60–I67 are connected in series so as to delay the signal KLZB to generate a signal DKLZB. The fuses F1–F4 are respectively connected in parallel to one pair of series inverters (I60, I61), (I62, I63), (I64, I65), (I66, I67) to control the time delay of the signal KLZB.

Those fuses can be cut out one after another to increase the time to delay the signal KLZB. Therefore, the more fuses that are cut out, the longer the signal KLZB is delayed.

If the time to delay the signal KLZB increases, it takes longer for the internal output control signal to shift to the high level thereof. In other words, if the time to delay the signal is changed in the variable delay circuit, the time to enable the signal OE can be varied.

Figure 11:
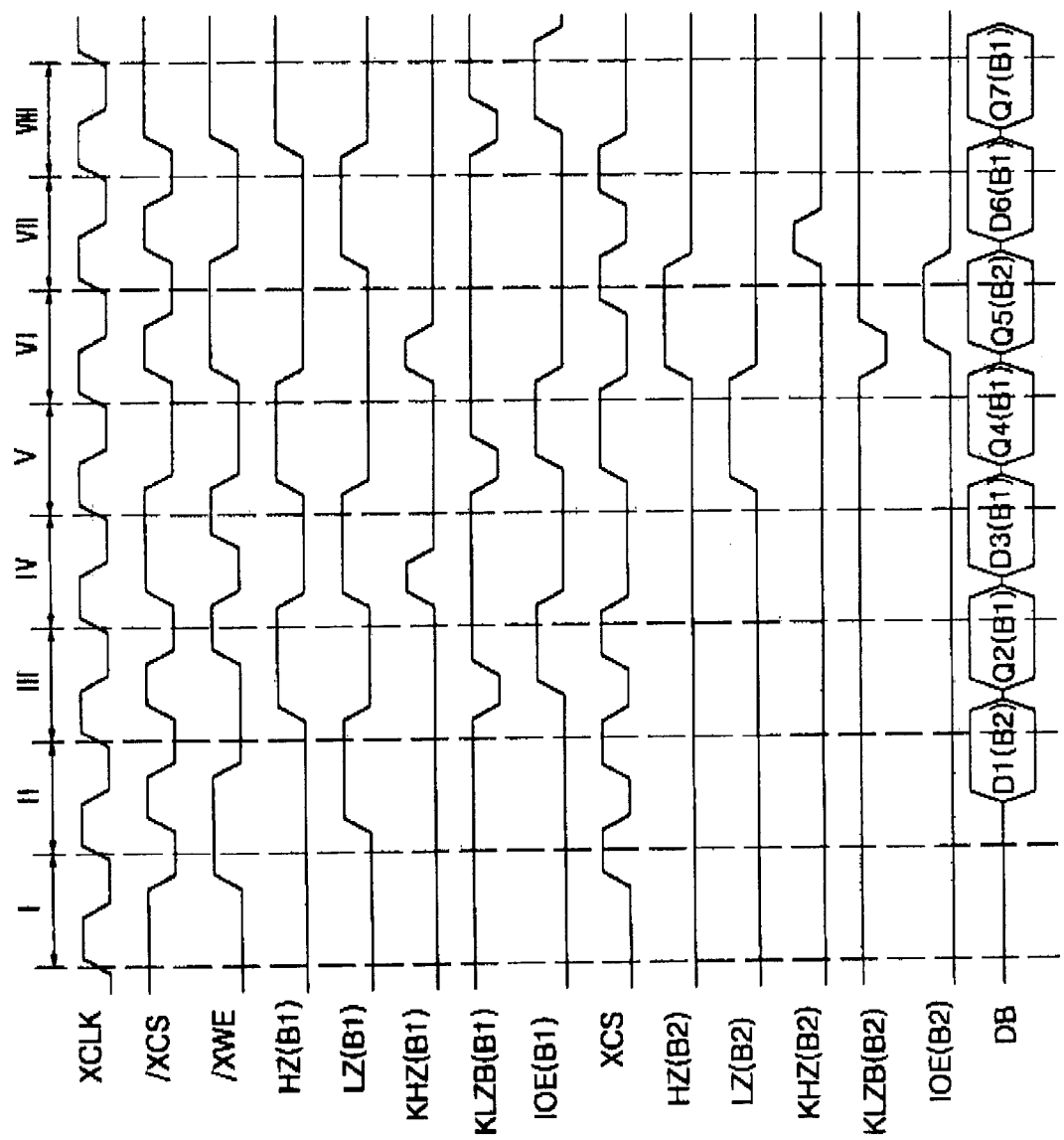
FIG. 11 is an operational timing diagram for illustrating operational procedures of the semiconductor memory device shown in FIG. 6 in case that it is applied to the system in FIG. 1.

FIG. 11 is an operational timing diagram for illustrating the operational procedures of the semiconductor memory device shown in FIG. 6 in case that it is applied to the system in FIG. 1. The operational procedures are described in cycle below. The reference symbols indicated by B1, B2 in FIG. 11 are respectively those signals internally generated in the RAMs 12, 14 shown in FIG. 1.

In the diagram of FIG. 11, the control signals inputted from outside at each cycle are the same as those shown in FIG. 5.

At the first cycle I, each of the signals LZ (B1), LZ (B2), HZ (B1), HZ (B2) of the control circuit 36 at the RAMs 12, 14 are the low levels thereof.

At the second cycle II, the signal LZ (B1) of the control circuit 36 of the RAM 12 shifts to the high level thereof in response to the clock signal CLK. And the RAM 14 writes the write data D1 (B2) transmitted by the data bus DB.

At the third cycle III, the signal LZ (B1) of the control circuit 36 at the RAM 12 turns to the low level thereof, and the signal HZ (B1) shifts to the high level thereof. Also, the signal KLZB (B1) shifts to the low level thereof in response to the high level of the clock signal, and then, it makes the output control signal IOE (B1) shift to the high level thereof. Therefore, the RAM 12 outputs the data Q2 (B1) to the data bus DB.

At the fourth cycle IV, the signal HZ (B1) of the control circuit 36 in the RAM 12 turns to the low level thereof, and the signal LZ (B1) shifts to the high level thereof. Also, the signal KHZ shifts to the high level thereof in response to the high level of the clock signal. The output control signal IOE (B1) shifts to the low level thereof. Therefore, the RAM 12 inputs the write data D3 (B1) inputted through the data bus DB.

At the fifth cycle V, the signal HZ (B1) of the control circuit 36 in the RAM 12 turns to the high level thereof, and the signal LZ (B1) shifts to the low level thereof. Also, the signal KLZB (B1) shifts to the low level thereof in response to the high level of the clock signal. The output control signal IOE (B1) shifts to the high level thereof in response to the signal KLZB (B1) which has shifted to its low level thereof. The signal LZ (B2) of the control circuit 36 in the RAM 14 shifts to the high level thereof. Therefore, the RAM 12 outputs the write data Q4 (B1) to the data bus DB.

At the sixth cycle VI, the signal HZ (B1) of the control circuit 36 in the RAM 12 turns to the low level thereof, and the signal KHZ (B1) shifts to the high level thereof in response to the high level of the clock signal. Also, the output control signal IOE (B1) shifts to the low level thereof. The signals HZ (B2) LZ (B2) of the control circuit 36 in the RAM 14 respectively shift to the high and low levels thereof. The signal KLZB (B2) shifts to the low level thereof in response to the high level of the clock signal. The output control signal IOE (B2) shifts to the high level thereof in response to the signal KLZB (B2) which has shifted to the low level thereof. Therefore, the RAM 14 outputs the data Q5 (B2) to the data bus DB.

At the seventh cycle VII, the signal LZ (B1) of the control circuit 36 in the RAM 12 turns to the high level thereof, and the signal HZ (B2) of the control circuit 36 in the RAM 14 turns to the low level thereof. Also, the signal KHZ (B2) shifts to the high level thereof in response to the high level of the clock signal. The output control signal IOE (B2) shifts to the low level thereof. Therefore, the RAM 12 inputs the data D6 (B1) inputted through the data bus DB.

At the eighth cycle, the signal LZ (B1) of the control circuit 36 in the RAM 12 turns to the low level thereof, and the signal KLZB (B1) shifts to the low level thereof in response to the high level of the clock signal. The output control signal IOE (B1) shifts to the high level thereof in response to the signal KLZB (B1) which has shifted to the low level thereof. Therefore, the RAM 12 outputs the data Q7 (B1) to the data bus DB.

The semiconductor memory device of the present invention separately generates the signals KLZB, KHZ, the two of which respectively control shifting the internal output control signal to the high and low levels thereof. Those signals KLZB, KHZ are used for generating the internal output control signal, thereby preventing the load on the data line from delaying transmission of the output control signal.

Furthermore, the system having the semiconductor memory devices with a commonly shared data bus controls the time for enabling the internal output control signal by using the variable delay circuit of the internally installed repeaters, so as to prevent the data conflict on the data bus.

Only the structure and operational procedures of the system having the two semiconductor memory devices and a processor, especially with a commonly shared data bus, have been described in the aforementioned embodiment. However, one processor can also be applied to the system having more than two semiconductor memory devices.

For example, if a system has a processor and four semiconductor memory devices, a processor combines two inverse chip selection signals to control those four semiconductor memory devices and, then, enables the combined signal to one of those devices. In other words, if the semiconductor memory devices of the present invention are applied to a system, the data conflict can be prevented on the data bus.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

The semiconductor memory device of the present invention can generate a control signal which controls shifting of the internal output control signal to the high or low level thereof, thereby reducing the time taken to delay transmission of the control signal which may be caused by the load on the data line.

In addition, the system having the semiconductor memory device of the present invention can control the time to enable the internal output control signal, so that the data conflict can be prevented on the data bus located between the semiconductor memory devices and the processor.

What is claimed is:

1. A system comprising first and second semiconductor memory devices sharing a data input/output bus, and a processor that transmits a clock signal, a read/write control signal and a chip selection control signal to control operations of the first and second semiconductor memory devices, wherein each of the semiconductor memory devices comprises:

at least two groups of data input/output drivers;

a control circuit to generate first and second control signals in response to an externally-supplied clock signal, read/write control signal, and chip selection control signal, the control circuit asserting the first control signal when the externally-supplied signals indicate a read command for a current memory cycle and the externally-supplied signals indicated a write command or a non-selection command for the preceding memory cycle, the control circuit asserting the second control signal when the signals indicate a write command or a non-selection command for a current memory cycle and the control signals indicated a read command for the preceding memory cycle; and a repeater for each group of data input/output drivers, each repeater generating an internal output control signal for its driver group, the assertion of the internal output control signal responsive to the first control signal, and the deassertion of the internal output control signal responsive to the second control signal.

2. The device, as defined in claim 1, wherein the control circuit comprises:

first and second inverters to respectively invert the chip selection control signal and the read/write control signal;

first and second CMOS transmission gates to respectively transmit the output signals of the first and second inverters in response to a first transition of the clock signal;

first and second latches to respectively latch the output signals of the first and second CMOS transmission gates;

a third inverter to invert the output signal of the second CMOS transmission gate;

a first AND gate to AND the output signals of the first CMOS transmission gate and the third inverter;

a third CMOS transmission gate to transmit the output signal of the first AND gate in response to a second transmission of the clock signal;

a third latch to latch the output signal of the third CMOS transmission gate;

delay means to delay the output signal of the third CMOS transmission gate by one cycle in response to the clock signal;

fourth and fifth inverters to respectively invert the output signals of the third CMOS transmission gate and the delay means;

a second AND gate to AND the output signals of the third CMOS transmission gate and the fourth inverter to generate a first state change signal; and a third AND gate to AND the output signals of the delay means and the fifth inverter to generate a second state change signal.

3. The device, as defined in claim 2, wherein the delay means is constructed with a D flip flop.

4. The device, as defined in claim 2, further comprising:

fourth and fifth CMOS transmission gates to respectively transmit the first and the second state change signals in response to the first transition of the clock signal;

fourth and fifth latches to latch and invert the output signals of the fourth and the fifth transmission gates;

first and second NOR gates to respectively invert and output the signals of the fourth and fifth latches when the clock signal is low;

a first self reset circuit to generate the first control signal by inputting the output signal of the first NOR gate; and a second self reset circuit to generate the second control signal by inputting the output signal of the second NOR gate.

5. The device, as defined in claim 4, wherein the first self reset circuit resets the first control signal at a first state as an initial state of operation, shifts the first control signal to a second state if the output signal of the first NOR gate shifts to a triggering state, and then resets the first control signal to the first state after a predetermined time period has elapsed.

6. The device, as defined in claim 5, wherein the first self reset circuit comprises:

a sixth inverter to invert the output signal of the first NOR gate;

a first inverting and delaying circuit to invert and delay the first control signal;

a first inverse circuit to generate an output signal at a first output state when both the output signal of the sixth inverter and the output signal of the inverting and delaying circuit are set to the opposite state, and to generate the output signal at the opposite state when the output signal of the inverting and delaying circuit is set to the first output state;

a sixth latch to latch and invert the output signal of the first inverse circuit;

a seventh inverter to invert the output signal of the sixth latch;

an eighth inverter to invert the output signal of the seventh inverter;

a first NAND gate to NAND the output signals of the sixth latch and of the first NOR gate;

a ninth inverter to invert the output signal of the first NAND gate;

a tenth inverter to invert the output signal of the ninth inverter; and a first reset transistor to reset the first control signal to its first state in response to the output signal of the eighth inverter.

7. The device, as defined in claim 6, wherein the inverting and delaying circuit comprises five inverters connected in series, the first control signal taken at the output of the first of the five inverters.

8. The device, as defined in claim 6, wherein the first reset transistor is constructed of an NMOS transistor.

9. The device, as defined in claim 4, wherein the second self reset circuit resets the second control signal at a first state as an initial state of operation, shifts the second control signal to a second state if the output signal of the second NOR gate shifts to a triggering state, and then resets the second control signal to the first state after a predetermined time period has elapsed.

10. The device, as defined in claim 9, wherein the second self reset circuit comprises:

an eleventh inverter to invert the output signal of the second NOR gate;

a second inverting and delaying circuit to invert and delay the second control signal;

a second inverse circuit to generate an output signal at a first output state when both the output signal of the eleventh inverter and the output signal of the second inverting and delaying circuit are set to the opposite state, and to generate the output signal at the opposite state when the output signal of the inverting and delaying circuit is set to the first output state;

a seventh latch to latch and invert the output signal of the second inverse circuit;

a twelfth inverter to invert the output signal of the seventh latch;

a second NAND gate to NAND the output signals of the seventh latch and of the second NOR gate;

a thirteenth inverter to invert the output signal of the second NAND gate; and a second reset transistor to reset the second control signal to its first state in response to the output signal of the thirteenth inverter.

11. The device, as defined in claim 10, wherein the delaying circuit comprises three inverters connected in series.

12. The device, as defined in claim 11, wherein the second reset transistor is constructed with a first NMOS transistor.

13. The device, as defined in claim 1, wherein each repeater comprises:

a variable delay circuit to delay the first control signal;

a driver to generate an output signal having a first state in response to the assertion of the delayed first control signal, and a second state in response to the assertion of the second control signal;

an eighth latch to latch the output signal of the driver; and internal output control signal generating means for generating an internal output control signal using the output signal of the eighth latch.

14. The device, as defined in claim 13, wherein the variable delay circuit comprises:

multiple inverters connected in series;

at least one fuse connected in parallel across an even number of the inverters such that the even number of inverters add delay when the fuse is cut.

15. The device, as defined in claim 13, wherein the driver comprises:

a second PMOS transistor to generate the first state of the driver output signal in response to the output signal of the variable delay circuit; and a third NMOS transistor to generate the second state of the driver output signal in response to the second control signal.

16. The device, as defined in claim 13, wherein the internal output control signal generating means comprises a fourth AND gate to AND an externally-supplied output control signal with the output signal of the eighth latch.

17. A system comprising first and second semiconductor memory devices sharing a data input/output bus, and a processor that transmits a clock signal, a read/write control signal and a chip selection control signal to control operations of the first and second semiconductor memory devices, wherein each of the semiconductor memory devices comprises:

at least two groups of data input/output drivers;

a control circuit to generate first and second control signals in response to an externally-supplied clock signal, read/write control signal, and chip selection control signal, the control circuit asserting the first control signal when the externally-supplied signals indicate a read command for a current memory cycle and the externally-supplied signals indicated a write command or a non-selection command for the preceding memory cycle, the control circuit asserting the second control signal when the signals indicate a write command or a non-selection command for a current memory cycle and the control signals indicated a read command for the preceding memory cycle; and a repeater for each group of data input/output drivers, each repeater generating an internal output control signal for its driver group, the assertion of the internal output control signal responsive to the first control signal, and the deassertion of the internal output control signal responsive to the second control signal.

18. The system of claim 17, further comprising one or more additional semiconductor memory devices, similar to the first and second memory devices, sharing the data input/output bus.

19. A semiconductor memory device comprising:

at least two data input/output drivers;

a driver control circuit to generate an output control signal for the data input/output drivers in response to externally-supplied chip control signals, the driver control circuit comparing the command represented by the externally-supplied chip control signals for the current and the last memory cycles and delaying the assertion of the output control signal by at least a first preset interval following a clock signal when the current command is a read command and the last command was a write command or a non-selection command.

20. A semiconductor memory device of claim 19, wherein the driver control circuit deasserts the output control signal at a second preset interval following a clock signal when the last command was a read command and the current command is a write command or a non-selection command.

21. A semiconductor memory device of claim 20, wherein the data input/output drivers are arranged in multiple driver groups, the driver control circuit comprising an intermediate control signal generator and multiple repeaters, one repeater per driver group, each repeater using intermediate control signals from the intermediate control signal generator to generate the output control signal for its driver group.

22. A semiconductor memory device of claim 21, wherein the intermediate control signal generator generates a first pulsed intermediate control signal when the current command is a read command and the last command was a write command or a non-selection command, and a second pulsed intermediate control signal when the last command was a read command and the current command is a write command or a non-selection command.

23. A semiconductor memory device of claim 21, wherein each repeater comprises a delay circuit to delay the first pulsed intermediate control signal, a latch to hold the state of the last to occur of the delayed first pulsed control signal and the second pulsed control signal, and combination logic to assert the output control signal when the latch state and an externally-supplied output enable signal are both asserted.

24. A semiconductor memory device of claim 23, wherein the delay circuit comprises:

multiple inverters connected in series;

at least one fuse connected in parallel across an even number of the inverters such that the even number of inverters add delay if the fuse is cut.

* * * * *

UNITED STATES PATENT AND TRADEMARK OFFICE
CERTIFICATE OF CORRECTION

PATENT NO. : 6,195,296 B1
DATED : February 27, 2001
INVENTOR(S) : Cheol

It is certified that error appears in the above-identified patent and that said Letters Patent is hereby corrected as shown below:

Column 1,
Line 45, "available" should read -- avoidable --.

Column 14,
Line 65, "A system comprising first and second semiconductor memory devices sharing a data input/output bus, and a processor that transmits a clock signal, a read/write control signal and a chip selection control signal to control operations of the first and second semiconductor memory devices, wherein each of the semiconductor memory devices comprises:" should read -- A semiconductor memory device comprising: --.

Signed and Sealed this

Sixth Day of August, 2002

Attest:

Attesting Officer

JAMES E. ROGAN
*Director of the United States Patent and Trademark Office*